United States Patent
Komine (10) Patent No.: US 10,488,754 B2
(45) Date of Patent: Nov. 26, 2019

(54) IMPRINT APPARATUS AND MANUFACTURING METHOD OF SEMICONDUCTOR DEVICE

(71) Applicant: TOSHIBA MEMORY CORPORATION, Minato-ku, Tokyo (JP)

(72) Inventor: Nobuhiro Komine, Nagoya Aichi (JP)

(73) Assignee: TOSHIBA MEMORY CORPORATION, Tokyo (JP)

( * ) Notice: Subject to any disclaimer, the term of this patent is extended or adjusted under 35 U.S.C. 154(b) by 0 days.

(21) Appl. No.: 15/696,117

(22) Filed: Sep. 5, 2017

(65) Prior Publication Data

US 2018/0217493 A1   Aug. 2, 2018

(30) Foreign Application Priority Data

Jan. 31, 2017   (JP) .................. 2017-015441

(51) Int. Cl.
G03F 7/00 (2006.01)
H01L 21/311 (2006.01)
H01L 21/027 (2006.01)
H01L 21/768 (2006.01)

(52) U.S. Cl.
CPC ........ G03F 7/0002 (2013.01); H01L 21/0271 (2013.01); H01L 21/31116 (2013.01); H01L 21/31144 (2013.01); H01L 21/76816 (2013.01)

(58) Field of Classification Search
USPC ........................................ 438/700; 355/77
See application file for complete search history.

(56) References Cited

U.S. PATENT DOCUMENTS

| | | | |
|---|---|---|---|
| 8,237,133 B2* | 8/2012 | Ganapathisubramanian | B82Y 10/00 250/453.11 |
| 8,550,801 B2* | 10/2013 | Furutono | B29C 59/022 264/293 |
| 8,946,093 B2 | 2/2015 | Mikami | |
| 2009/0224436 A1* | 9/2009 | Mikami | B82Y 10/00 264/447 |
| 2013/0078820 A1* | 3/2013 | Mikami | G03F 7/0002 438/778 |
| 2013/0078821 A1* | 3/2013 | Furutono | G03F 7/0002 438/780 |
| 2015/0062712 A1* | 3/2015 | Tazawa | G02B 1/118 359/599 |

FOREIGN PATENT DOCUMENTS

| | | |
|---|---|---|
| JP | 2012-016829 A | 1/2012 |
| JP | 4958087 B2 | 6/2012 |
| JP | 5644906 A | 12/2014 |
| JP | 5773024 B2 | 9/2015 |

* cited by examiner

*Primary Examiner* — Thien F Tran
(74) *Attorney, Agent, or Firm* — Foley & Lardner LLP (57) ABSTRACT

A plurality of light sources are provided and are able to be independently turned on and turned off. The light sources have directionality in directions of shot regions. The light sources, which are turned on so as to correspond to the shape of the shot region, are selected, thereby preventing an imprint material outside the shot region from being cured when an imprint pattern in the shot region is cured.

19 Claims, 13 Drawing Sheets

IMPRINT APPARATUS AND MANUFACTURING METHOD OF SEMICONDUCTOR DEVICE

CROSS-REFERENCE TO RELATED APPLICATION

This application claims the benefit of and priority to Japanese Patent Application No. 2017-015441, filed Jan. 31, 2017, the entire contents of which are incorporated herein by reference.

FIELD

Embodiments described herein relate generally to an imprint apparatus and a manufacturing method of a semiconductor device.

BACKGROUND

Imprint lithography with the miniaturization of a semiconductor device is more advantageous in cost reduction than photolithography. In the imprint lithography, there is a method for irradiating an imprint material with ultraviolet light while pressing a template to the imprint material, in order to cure an imprint pattern.

DETAILED DESCRIPTION

An example embodiment provides an imprint apparatus capable of transferring a template pattern to an imprint material while optimizing a curing range of the imprint material, and a manufacturing method of a semiconductor device.

In general, according to some embodiments, an imprint apparatus may include a plurality of light sources and a light source distribution control module. The plurality of light sources are able to be independently turned on and turned off and generate ultraviolet light having directionality in directions of shot regions. The light source distribution control module may control a distribution of the light sources to be turned on, for each shot region.

In the following, an imprint apparatus and a manufacturing method of a semiconductor device according to example embodiments will be described in detail with reference to the accompanying drawings. It is noted that the present disclosure is not limited to these example embodiments.

FIG. 1A to FIG. 1E are sectional views illustrating an imprint method according to some embodiments.

Figure 1A:
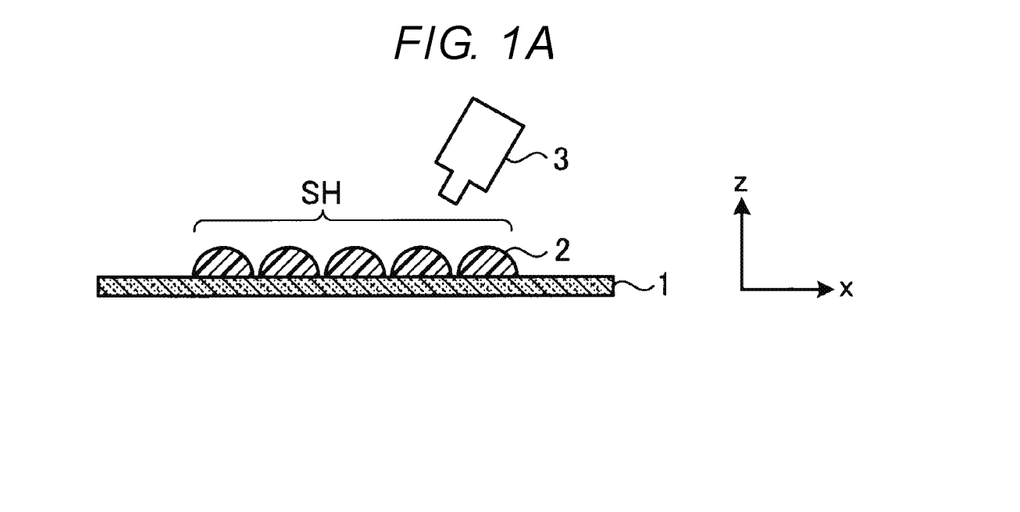
FIG. 1A, FIG. 1B, FIG. 1C, FIG. 1D, and FIG. 1E are sectional views illustrating an imprint method according to some embodiments.

In FIG. 1A, a base 1 is provided with a shot region SH. An imprint material 2 may be dropped from a dropping unit 3 (e.g., a dropper) to the shot region SH on the base 1. The base 1 may be a semiconductor layer, an insulating layer, or a conductive layer. As a material of the imprint material 2, for example, a resist material can be used. As the resist material, for example, an ultraviolet curing resin can be used. In the dropping of the imprint material 2, the imprint material 2 may be discharged onto the base 1 by an inkjet method. In FIG. 1A, two directions which are parallel to a principal surface of the base 1 and are orthogonal to each other are referred to as an "X-direction" and a "Y-direction", and a direction which is orthogonal to both the X-direction and the Y-direction is referred to as a "Z-direction (stacking direction)".

Figure 1B:
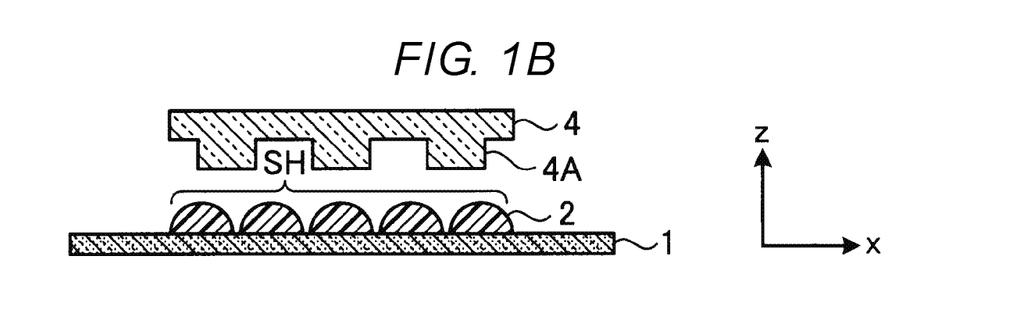

As illustrated in FIG. 1B, a template 4 is provided with a template pattern 4A. The template pattern 4a can be provided with an uneven pattern. A width of a recess portion of the uneven pattern can be set in the order of nanometers. As the template 4, it is possible to use a material that allows ultraviolet light to pass therethrough, for example, quartz.

Figure 1C:
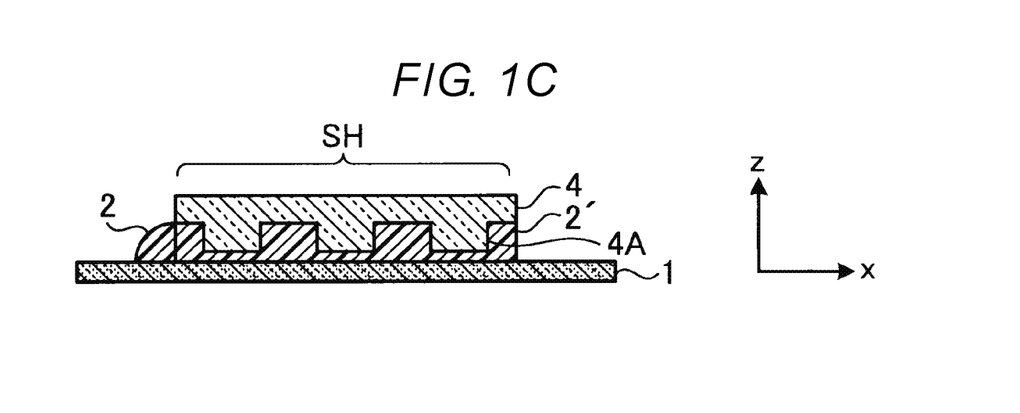

Next, as illustrated in FIG. 1C, the template 4 is pressed to the imprint material 2 to transfer the template pattern 4A to the imprint material 2, so that an imprint pattern 2' is formed. When the template 4 is pressed to the imprint pattern 2', a part of the imprint material 2 may protrude beyond the shot region SH.

Figure 1D:
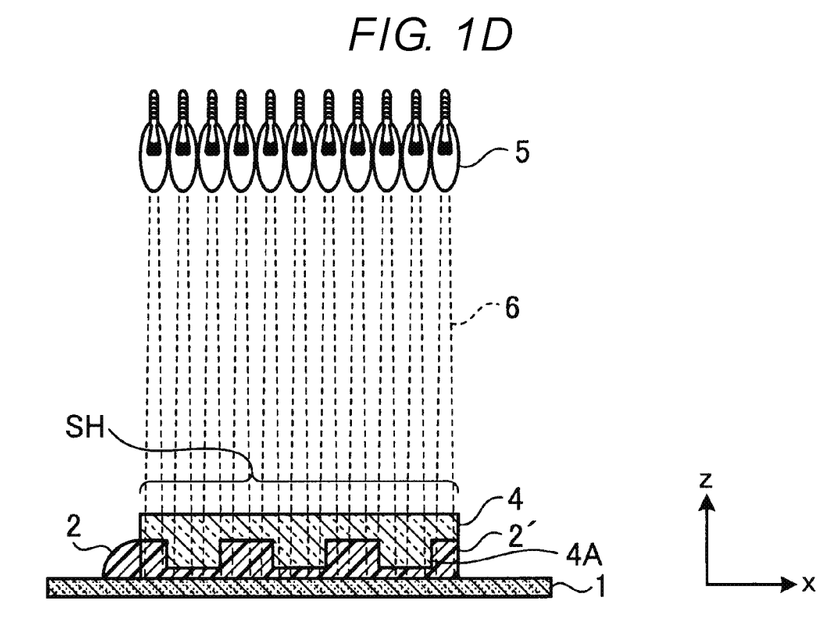

Next, as illustrated in FIG. 1D, light sources 5 are turned on to irradiate the imprint pattern 2' with ultraviolet light 6 while the template 4 is being pressed to the imprint pattern 2', so that the imprint pattern 2' is cured. The light sources 5 may be provided in a plural number. These plurality of light sources 5 can be independently turned on and off. The light source 5 may have directionality in the direction of the shot region SH. In this case, when the imprint pattern 2' in the shot region SH has been cured, the imprint material 2 out of the shot region SH can be prevented from being cured. The light source 5 can use a light emitting diode. A distribution of light sources 5, which are turned on when the imprint pattern 2' is cured, can be controlled in each shot region SH. In this case, it is possible to select light sources 5 which are simultaneously turned on to emit the ultraviolet light 6 corresponding to the shape of the shot region SH. When the light sources 5, which are simultaneously turned on to emit the ultraviolet light 6 corresponding to the shape of the shot region SH, are selected, it is possible to designate whether which light sources 5 are turned on and which light sources 5 to be turned off among the plurality of light sources 5 while positions of all the light sources 5 are being fixed.

Figure 1E:
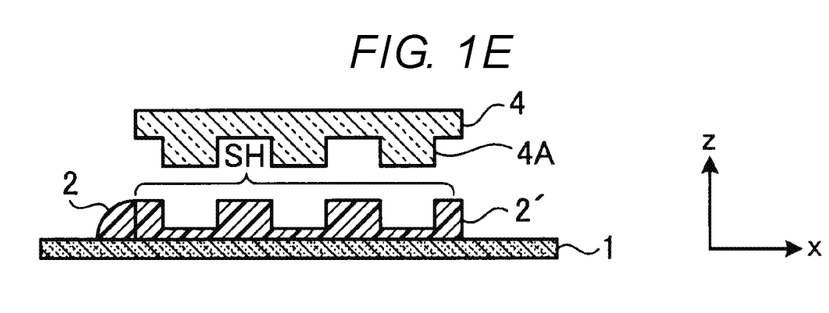

Next, as illustrated in FIG. 1E, the template 4 is separated from the imprint pattern 2'. In this case, an uncured imprint material 2 may remain at a side of the imprint pattern 2'. The uncured imprint material 2 may be reused as an imprint material of a next shot, or may be removed before the next shot is performed.

When the light sources 5, which are simultaneously turned on so as to emit the ultraviolet light 6 corresponding to the shape of the shot region SH, are selected, it is possible to prevent the imprint material 2 protruding beyond the shot region SH from being cured while preventing a reduction in throughput due to the curing of the imprint material 2 in the shot region SH. Therefore, it is possible to prevent the imprint material 2 protruding beyond the shot region SH from being an obstacle or dust when the next shot is performed, and to improve the quality of the imprint pattern 2' formed by imprint lithography while preventing a reduction in productivity.

Figures 2A, 2C:
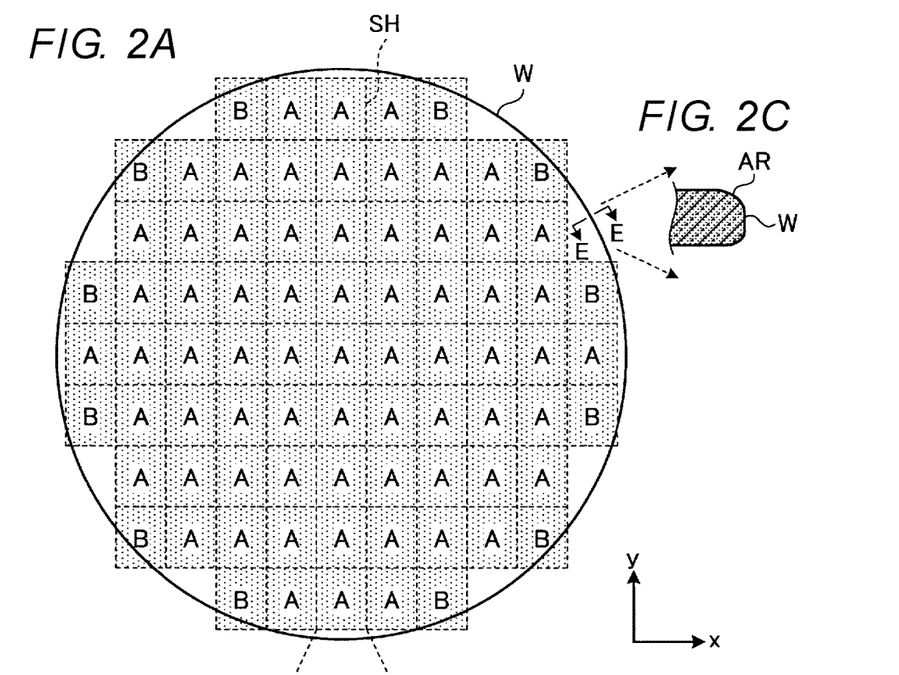
FIG. 2A is a plan view illustrating an example of a shot region of an imprint method according to some embodiments.
FIG. 2C is an enlarged sectional view illustrating an end portion of a wafer W of FIG. 2A.
Figure 2B:
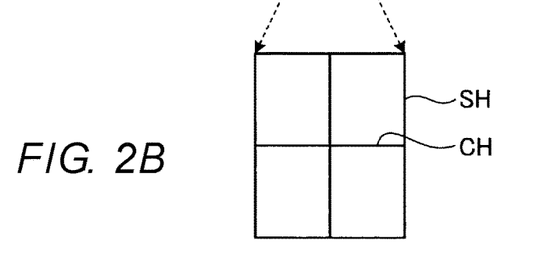
FIG. 2B is a plan view illustrating an example of chip regions arranged in the shot region of FIG. 2A.

FIG. 2A is a plan view illustrating an example of the shot regions of the imprint method according to some embodiments, FIG. 2B is a plan view illustrating an example of chip regions arranged in the shot region of FIG. 2A, and FIG. 2C is an enlarged sectional view illustrating an end portion of the wafer W of FIG. 2A. FIG. 2C is a view taken along line E-E of FIG. 2A.

In FIG. 2A, the wafer W may be provided with the shot regions SH. The shot region SH can be allowed to correspond to a region where the imprint pattern 2' is formed by ultraviolet irradiation at a time. The shot region SH may be provided with full shot regions A and imperfect shot regions B. The full shot region A may be a region where all template patterns corresponding to the shot regions SH are transferable.

The imperfect shot region B may be a region including a region where a part of template patterns corresponding to the shot regions SH is not transferable. A part of the imperfect shot region B may protrude beyond the wafer W. As illustrated in FIG. 2C, the wafer W is not flat over its full surface and there is a rounded region AR at an end portion of the wafer W. In this case, the imperfect shot region B can be allowed to correspond to a region obtained by excluding a region out of the rounded region AR from the full shot region A.

As illustrated in FIG. 2B, the shot region SH is provided with a chip region CH. In one shot region SH, (2×2) chip regions CH may be arranged in an x direction and a y direction, (2×3) chip regions CH may be arranged, or (2×4) chip regions CH may be arranged.

Figure 3A:
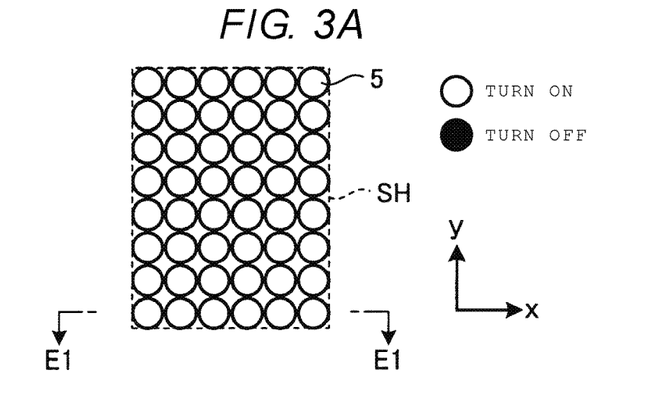
FIG. 3A is a plan view illustrating a setting method of a light source distribution in a full shot region of FIG. 2A.
Figure 3B:
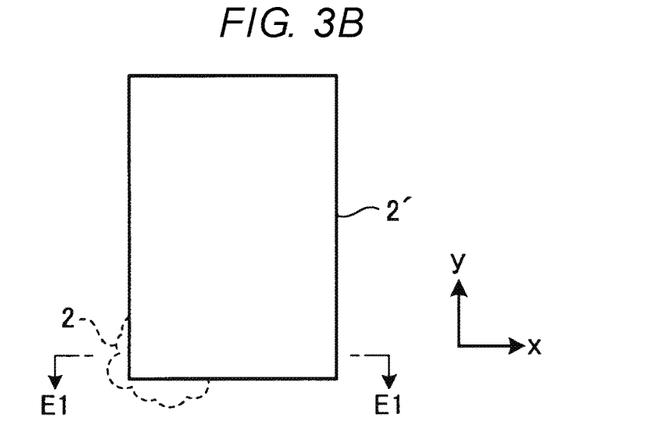
FIG. 3B is a plan view illustrating a cured imprint pattern corresponding to the light source distribution of FIG. 3A.
Figure 3C:
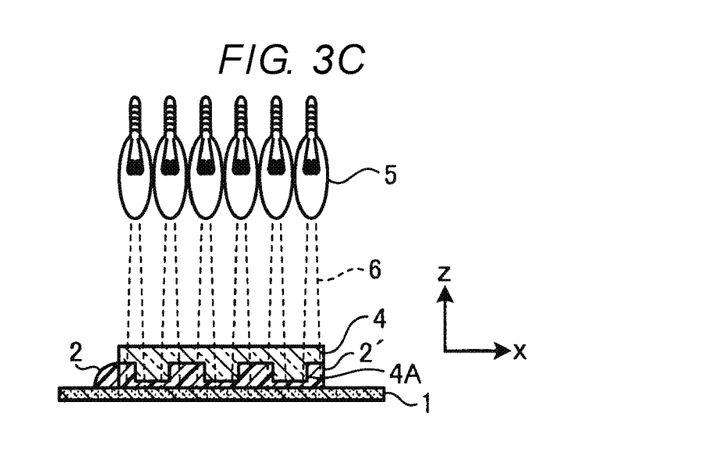
FIG. 3C is a sectional view illustrating a curing method of the imprint pattern corresponding to the light source distribution of FIG. 3A.
Figure 3D:
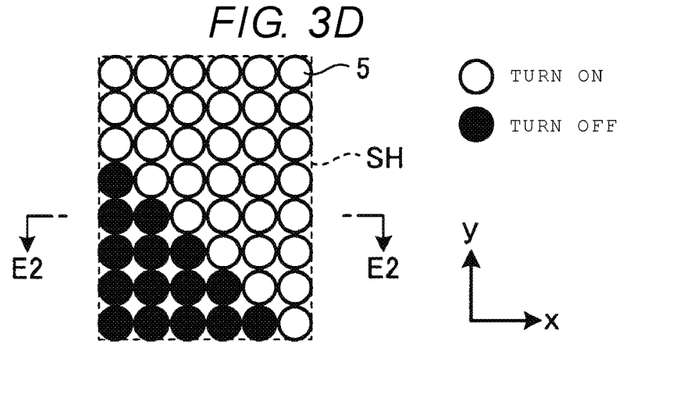
FIG. 3D is a plan view illustrating a setting method of the light source distribution in an imperfect shot region of FIG. 2A.
Figure 3E:
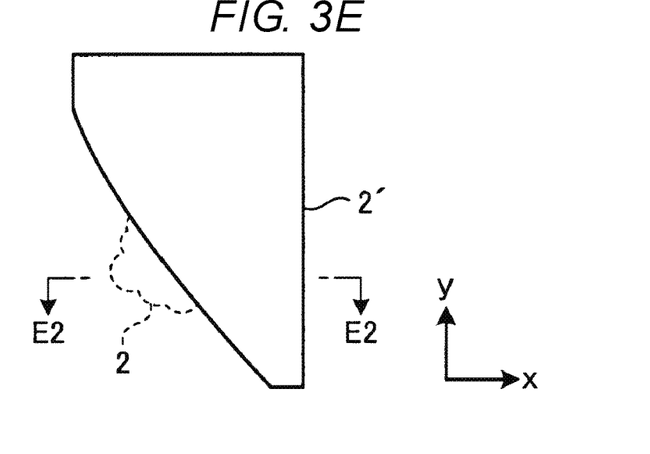
FIG. 3E is a plan view illustrating a cured imprint pattern corresponding to the light source distribution of FIG. 3D.
Figure 3F:
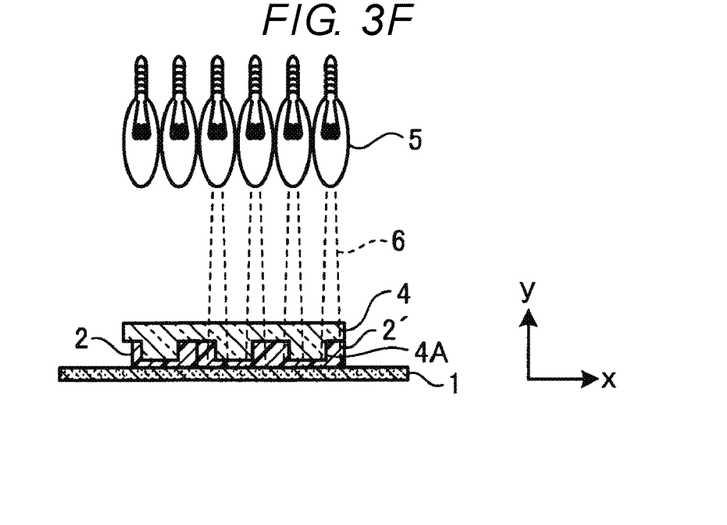
FIG. 3F is a sectional view illustrating a curing method of the imprint pattern corresponding to the light source distribution of FIG. 3D.
Figure 3G:
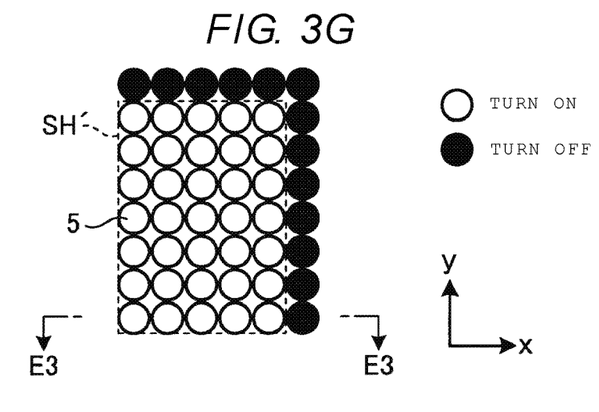
FIG. 3G is a plan view illustrating a setting method of the light source distribution in a full shot region with a shot layout different from the full shot region of FIG. 2A.
Figure 3H:
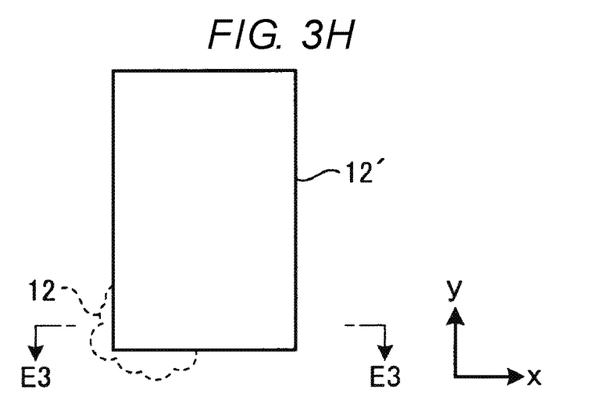
FIG. 3H is a plan view illustrating a cured imprint pattern corresponding to the light source distribution of FIG. 3G.
Figure 3I:
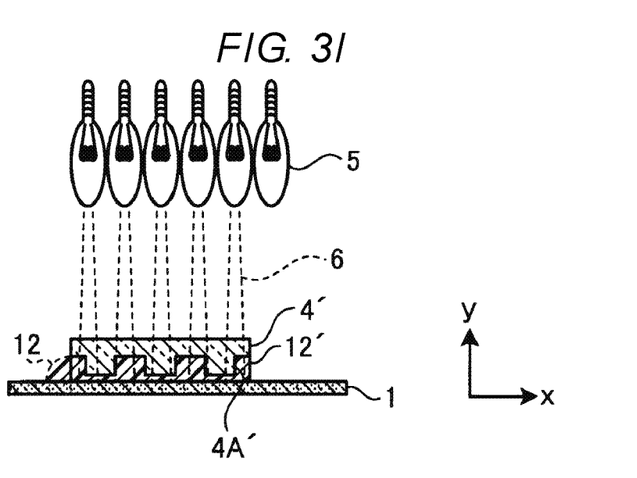
FIG. 3I is a sectional view illustrating a curing method of the imprint pattern corresponding to the light source distribution of FIG. 3G.

FIG. 3A is a plan view illustrating a setting method of a light source distribution in the full shot region of FIG. 2A. FIG. 3B is a plan view illustrating a cured imprint pattern corresponding to the light source distribution of FIG. 3A. FIG. 3C is a sectional view illustrating a curing method of the imprint pattern corresponding to the light source distribution of FIG. 3A. FIG. 3D is a plan view illustrating a setting method of a light source distribution in the imperfect shot region of FIG. 2A. FIG. 3E is a plan view illustrating a cured imprint pattern corresponding to the light source distribution of FIG. 3D. FIG. 3F is a sectional view illustrating a curing method of the imprint pattern corresponding to the light source distribution of FIG. 3D. FIG. 3G is a plan view illustrating a setting method of a light source distribution in a full shot region with a shot layout different from the full shot region of FIG. 2A. FIG. 3H is a plan view illustrating a cured imprint pattern corresponding to the light source distribution of FIG. 3G. FIG. 3I is a sectional view illustrating a curing method of the imprint pattern corresponding to the light source distribution of FIG. 3G.

FIG. 3C is a view taken along line E1-E1 of FIG. 3A and FIG. 3B. FIG. 3F is a view taken along line E2-E2 of FIG. 3D and FIG. 3E. FIG. 3I is a view taken along line E3-E3 of FIG. 3G and FIG. 3H.

As illustrated in FIG. 3A to FIG. 3G, the light sources 5 are arranged in the xy plane corresponding to the shot region SH. In this case, the light sources 5 can be arranged in the xy plane in a square array. As illustrated in FIGS. 3B and 3C, the imprint material 2 protrudes beyond the shot region SH. When the imprint pattern 2' is cured in the full shot region A, it is possible to select light sources 5, which are simultaneously turned on so as to emit the ultraviolet light 6 corresponding to the shape of the shot region SH. In this way, it is possible to prevent the imprint material 2 protruding beyond the shot region SH from being cured while preventing a reduction in throughput due to the curing of the imprint material 2 in the shot region SH.

As illustrated in FIG. 3E and FIG. 3F, when the imprint pattern 2' is cured in the imperfect shot region B, it is possible to select light sources 5, which are simultaneously turned on so as to emit the ultraviolet light 6 corresponding to the shape of the imperfect shot region B. In this way, it is possible to prevent the imprint material 2 protruding beyond the imperfect shot region B from being cured while preventing a reduction in throughput due to the curing of the imprint material 2 in the imperfect shot region B. In this case, it is possible to prevent the imprint material 2 attached to the rounded region AR of FIG. 2C from being cured. Therefore, it is possible to prevent the cured imprint material 2 in the rounded region AR from serving as a generation source of dust and the like.

As illustrated in FIG. 3I, in order to form an imprint pattern 12' different from the imprint pattern 2', the template 4 may be replaced with a template 4'. The template 4' may be provided with a template pattern 4A'. In this case, as illustrated in FIG. 3G, the shot region SH may be replaced with a shot region SH'. The size of the shot region SH' may be different from that of the shot region SH. As illustrated in FIG. 3H and FIG. 3I, an imprint material 12 protrudes beyond the shot region SH'. When the imprint pattern 12' is cured in the shot region SH', it is possible to select light sources 5, which are simultaneously turned on so as to emit the ultraviolet light 6 corresponding to the shape of the shot region SH'. In this way, it is possible to prevent the imprint material 12 protruding beyond the shot region SH' from being cured while coping with the layout change of the shot region SH'.

Figure 4:
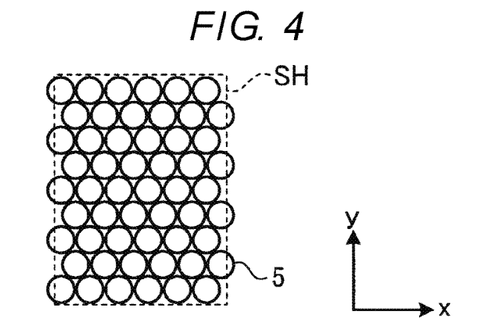
FIG. 4 is a plan view illustrating another arrangement method of light sources in an imprint method according to some embodiments.

FIG. 4 is a plan view illustrating another arrangement method of the light sources in the imprint method according to some embodiments.

As illustrated in FIG. 4, the light sources 5 are arranged in the xy plane in a staggered shape. In this arrangement method, the light sources 5 can be most densely filled in the xy plane. Therefore, as compared with the arrangement method of the light sources 5 in FIG. 3A to FIG. 3G, it is possible to increase the number of light sources 5 arrangeable in one shot region SH, and to achieve high precision of a distribution of light sources 5 to be turned on in the shot region SH.

Figure 5:
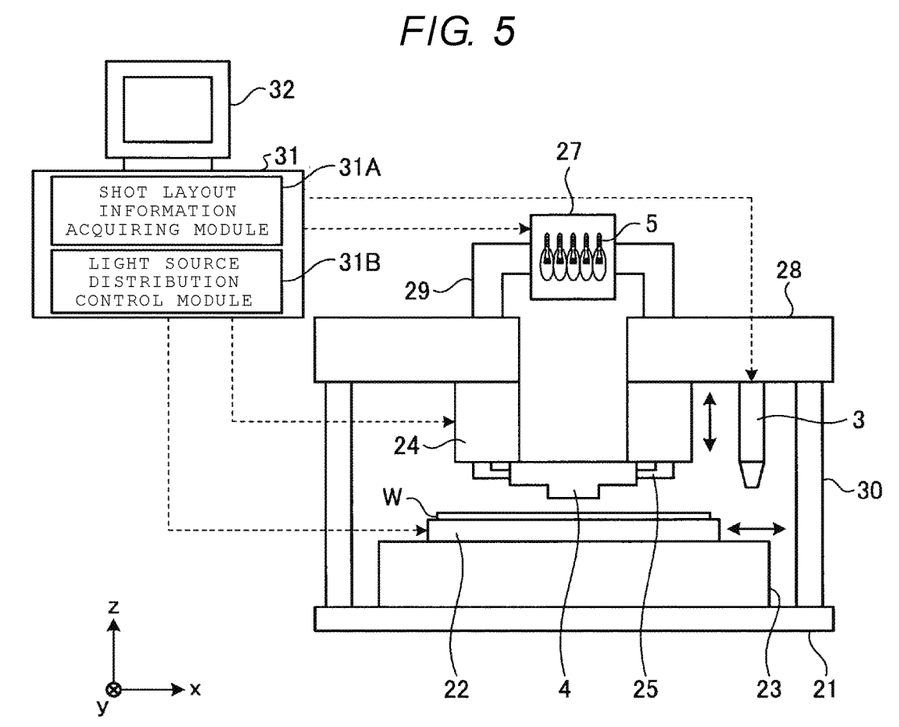
FIG. 5 is a side view illustrating a schematic configuration of an imprint apparatus according to some embodiments.

FIG. 5 is a side view illustrating a schematic configuration of an imprint apparatus according to some embodiments.

As illustrated in FIG. 5, the imprint apparatus is provided with a base 21 for supporting the overall apparatus, a stage 22 for placing the wafer W thereon, a horizontal driving unit 23 (e.g., a horizontal driver) for driving the stage 22 in a horizontal direction, a vertical driving unit 24 (e.g., a vertical driver) for driving the template 4 in a vertical direction, a support unit 25 (e.g., a support) for supporting the template 4 below the vertical driving unit 24, the dropping unit 3 for dropping an imprint material to the wafer W, an irradiation unit 27 (e.g., an irradiator) for irradiating the wafer W with ultraviolet light, a support unit 28 (e.g., a support) for supporting the vertical driving unit 24 and the dropping unit 3 above the wafer W, a support unit 29 for supporting the irradiation unit 27 above the template 4, and a support unit 30 (e.g., a support) for supporting the support unit 28 above the wafer W. The irradiation unit 27 may be provided with a plurality of light sources 5.

The imprint apparatus may be further provided with a control unit 31 (e.g., a controller) for controlling a nanoimprint operation and a display unit 32 (e.g., a display) for displaying a manipulation screen, a manipulation situation and the like of the imprint apparatus. The control unit 31 (e.g., a controller or a computer including a processor) may be provided with a shot layout information acquiring module 31A and a light source distribution control module 31B. The shot layout information acquiring module 31A can acquire shot layout information. The shot layout information can include information on the sizes and the positions of shot regions. The light source distribution control module 31B can control a distribution of the light sources 5, which are turned on when the shot regions are irradiated with ultraviolet light, for each shot region.

When the wafer W is conveyed on the stage 22, the stage 22 may be driven in the horizontal direction, so that shot regions of the wafer W are moved below the dropping unit 3. By using an inkjet method and the like, an imprint material may be dropped from the dropping unit 3 onto the wafer W. When an imprint material corresponding to one shot is dropped, the template 4 may fall down and may be pressed to the imprint material. In such a state, ultraviolet light may be emitted to the imprint material from the irradiation unit 27 via the template 4, so that the imprint material is cured, resulting in the formation of an imprint pattern in which the uneven pattern of the template 4 has been transferred to the imprint material. In this case, the light source distribution control module 31B may select, based on the shot layout information, light sources 5 which are simultaneously turned on so as to emit ultraviolet light corresponding to the shape of the shot region. In this way, it is possible to prevent an imprint material protruding beyond the shot region from being cured while preventing a reduction in throughput due to the curing of an imprint material in the shot region.

Figure 6:
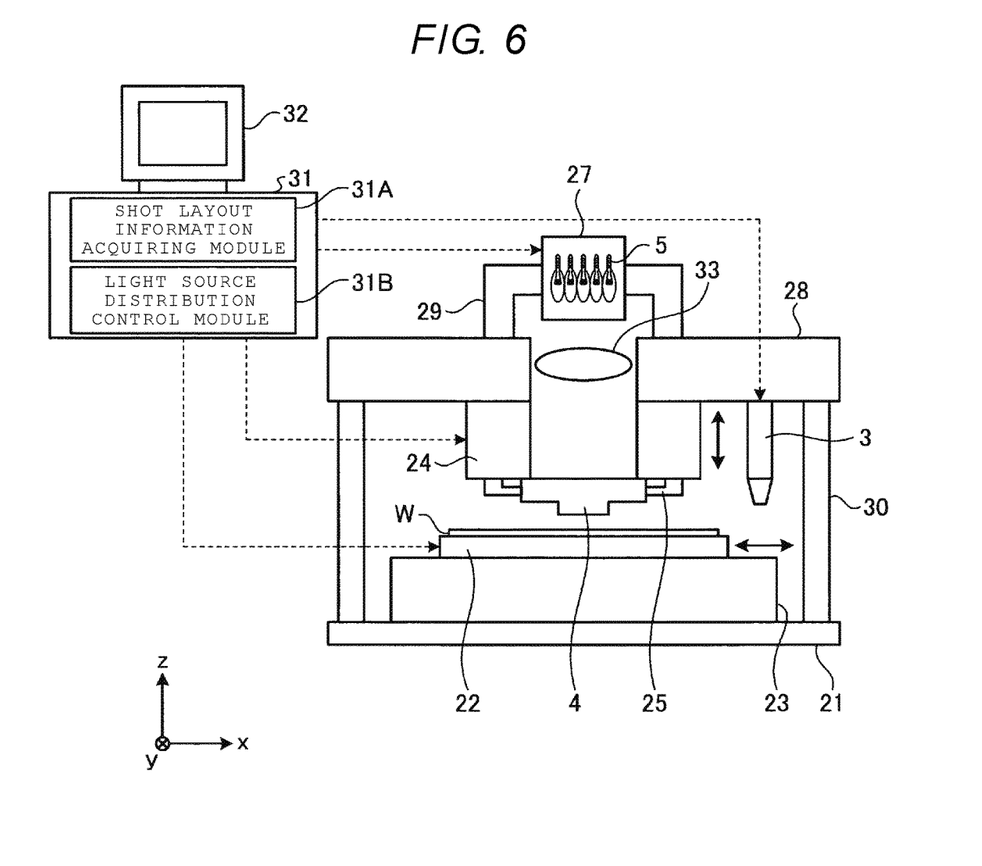
FIG. 6 is a side view illustrating a schematic configuration of an imprint apparatus according to some embodiments.

FIG. 6 is a side view illustrating a schematic configuration of an imprint apparatus according to some embodiments.

In the imprint apparatus of FIG. 6, a reduction projection optical system 33 is provided to the imprint apparatus of FIG. 5. The reduction projection optical system 33 may be disposed between the light sources 5 and the template 4. The reduction projection optical system 33 can reduce a distribution of turned-on light sources 5, thereby projecting the light sources 5 onto the wafer W.

When the wafer W is conveyed on the stage 22, the stage 22 may be driven in the horizontal direction, so that shot regions of the wafer W are moved below the dropping unit 3. By using an inkjet method and the like, an imprint material may be dropped from the dropping unit 3 onto the wafer W. When an imprint material corresponding to one shot reduced by the reduction projection optical system 33 is dropped, the template 4 may fall down and may be pressed to the imprint material. In such a state, ultraviolet light may be emitted from the irradiation unit 27 via the template 4. Then, a distribution of turned-on light sources 5 may be reduced by the reduction projection optical system 33, and then the imprint material may be irradiated with the ultraviolet light via the template 4, so that the imprint material is cured, resulting in the formation of an imprint pattern in which the uneven pattern of the template 4 has been transferred to the imprint material.

A distribution of turned-on light sources 5 may be reduced and shot regions may be irradiated with ultraviolet light, so that it is possible to achieve high precision of a distribution of light sources and to improve the accuracy of a boundary between a cured region and an uncured region of the imprint material.

Figure 7:
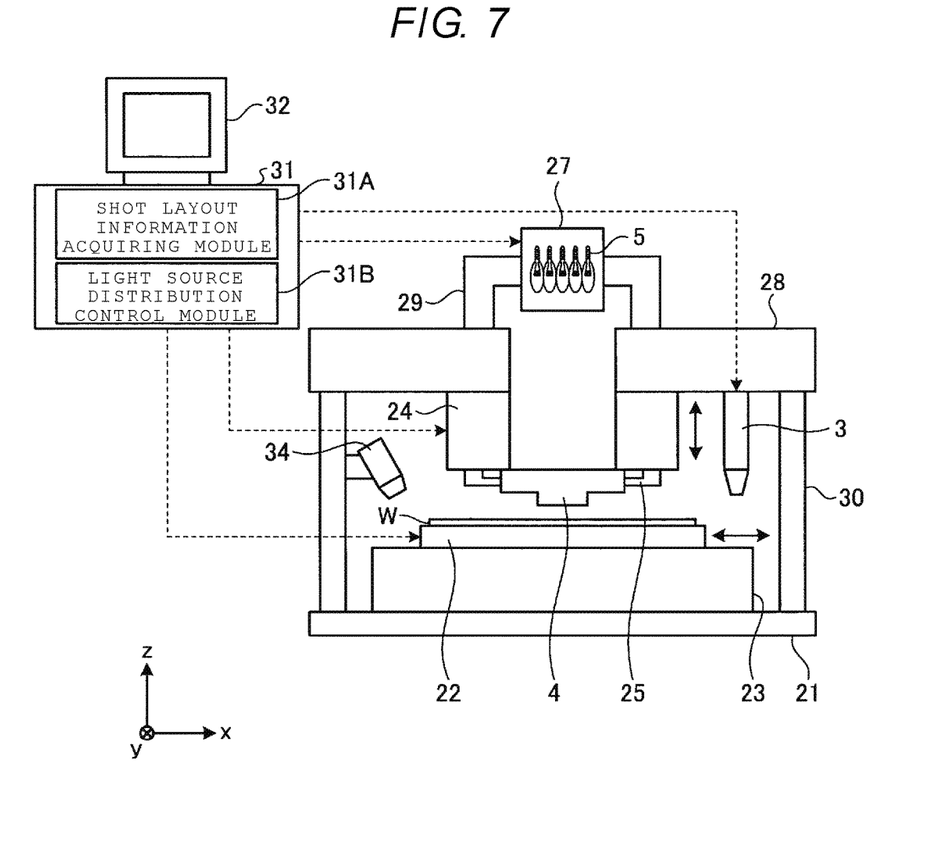
FIG. 7 is a side view illustrating a schematic configuration of an imprint apparatus according to some embodiments.

FIG. 7 is a side view illustrating a schematic configuration of an imprint apparatus according to some embodiments.

In the imprint apparatus of FIG. 7, a removal unit 34 (e.g., a remover) may be provided to the imprint apparatus of FIG. 5. The removal unit 34 can remove an uncured imprint material. In order to remove an uncured imprint material, for example, a cleaning solution may be sprayed to the uncured imprint material, thereby washing away the uncured imprint material.

When the wafer W is conveyed on the stage 22, the stage 22 may be driven in the horizontal direction, so that shot regions of the wafer W are moved below the dropping unit 3. By using an inkjet method and the like, an imprint material may be dropped from the dropping unit 3 onto the wafer W. When an imprint material corresponding to one shot is dropped, the template 4 may fall down and may be pressed to the imprint material. In such a state, the imprint material may be irradiated with ultraviolet light from the irradiation unit 27 via the template 4, so that the imprint material is cured, resulting in the formation of an imprint pattern in which the uneven pattern of the template 4 has been transferred to the imprint material.

After the template 4 is separated from the imprint pattern, the stage 22 may be driven in the horizontal direction, so that an uncured imprint material is moved below the removal unit 34. A cleaning solution may be sprayed to the uncured imprint material from the removal unit 34, so that the uncured imprint material protruding from a shot region of this time can be removed.

The uncured imprint material protruding from the shot region of this time may be removed, so that it is possible to prevent the uncured imprint material from being introducing into a shot region of next time. In this way, it is possible to prevent an uncured imprint material of a shot region of this time from having an influence on a distribution of an imprint material of a shot region of next time, thereby preventing the uncured imprint material from having an influence on dimensional accuracy of an imprint pattern of the shot region of next time.

Figure 8:
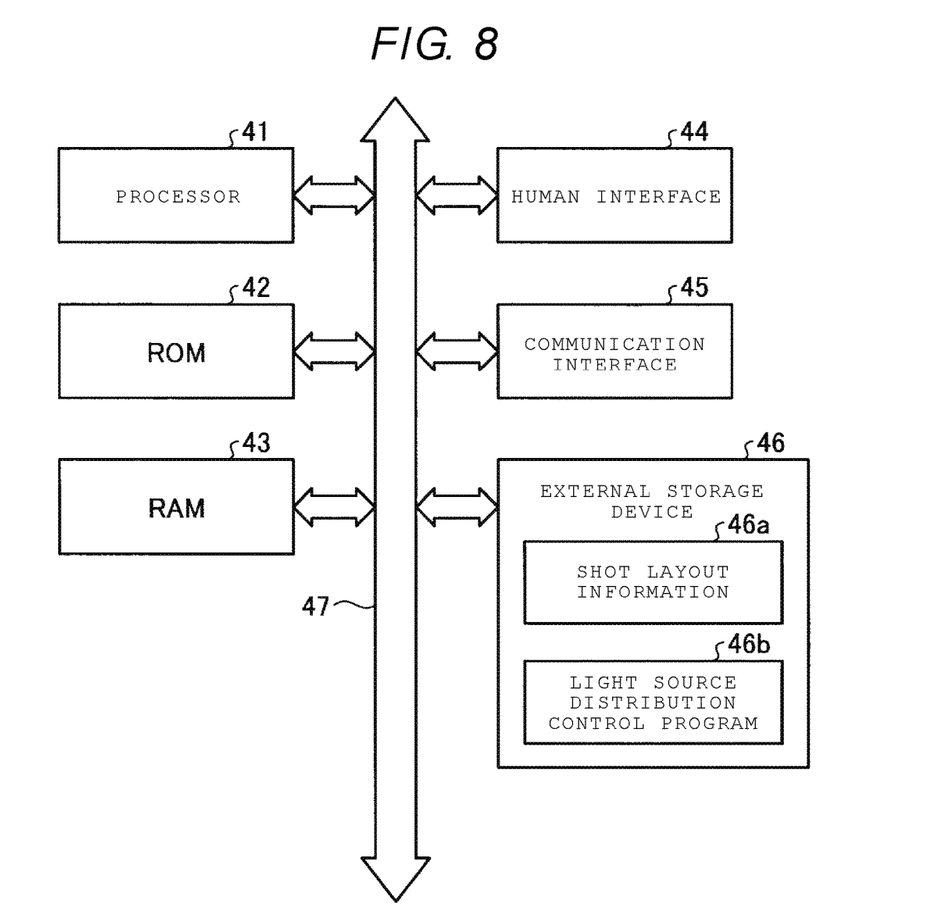
FIG. 8 is a block diagram illustrating a configuration of hardware executing a light source distribution control program according to some embodiments.

FIG. 8 is a block diagram illustrating a configuration of hardware executing a light source distribution control program according to some embodiments.

As illustrated in FIG. 8, the control unit 31 of FIG. 5 can be provided with a processor 41 including a CPU, a ROM 42 for storing stationary data, a RAM 43 for providing the processor 41 with a work area and the like, a human interface 44 for performing relay between the human and a computer, a communication interface 45 for providing a communication unit with an exterior, and an external storage device 46 for storing a program for operating the processor 41 and various pieces of data. The processor 41, the ROM 42, the RAM 43, the human interface 44, the communication interface 45, and the external storage device 46 may be connected to one another via a bus 47.

As the external storage device 46, for example, it is possible to use a magnetic disk such as a hard disk, an optical disk such as a DVD, a nonvolatile semiconductor storage device such as an SSD, a portable semiconductor storage device such as a USB memory and a memory card, and the like. Furthermore, as the human interface 44, for example, it is possible to use a keyboard, a mouse, and a touch panel as an input interface, and a display, a printer and the like as an output interface. Furthermore, as the communication interface 45, for example, it is possible to use a LAN card, a modem, a router and the like for connection to the Internet, a LAN and the like. In the external storage device 46, shot layout information 46a may be stored, and a light source distribution control program 46b may be installed.

When the light source distribution control program 46b is executed by the processor 41, the shot layout information 46a may be referred to, so that light sources 5, which are simultaneously turned on so as to emit ultraviolet light corresponding to the shape of a shot region, are selected.

The light source distribution control program 46b to be executed by the processor 41 may be stored in the external storage device 46, and may be read to the RAM 43 when the program is executed. Alternatively, the light source distribution control program 46b may be stored in the ROM 42 in advance. Further alternatively, the light source distribution control program 46b may be acquired via the communication interface 45. Furthermore, the light source distribution control program 46b may be executed on a stand-alone computer or a cloud computer.

FIG. 9A to FIG. 9G are sectional views illustrating a manufacturing method of a semiconductor device to which imprint lithography according to some embodiments is applied. In some embodiments, a method for forming a stepped structure in a stacked body is used an example.

Figure 9A:
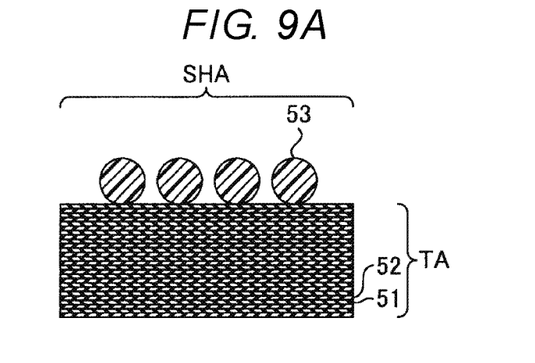
FIG. 9A, FIG. 9B, FIG. 9C, FIG. 9D, FIG. 9E, FIG. 9F, and FIG. 9G are sectional views illustrating a manufacturing method of a semiconductor device to which imprint lithography according to some embodiments is applied.

As illustrated in FIG. 9A, a shot region SHA is provided with a stacked body TA. In the stacked body TA, insulating layers 51 and 52 may be sequentially stacked. As a material of the insulating layer 51, for example, a silicon oxide film can be used. As a material of the insulating layer 52, for example, a silicon nitride film can be used. The stacked body TA may be a stack structure of an insulating layer and a conductive layer or a stack structure of an insulating layer and a semiconductor layer, in addition to the stack structure of the insulating layers 51 and 52. An imprint material 53 may be dropped on the stacked body TA. In the dropping of the imprint material 53, the imprint material 53 may be discharged onto the stacked body TA by an inkjet method.

Figure 9B:
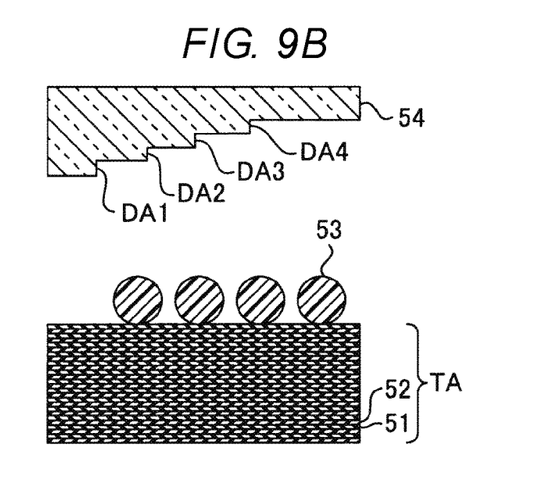

Next, as illustrated in FIG. 9B, a template 54 is disposed on the shot region SHA. The template 54 may be provided with stepped portions DA1 to DA4. A material of the template 54, for example, quartz can be used.

Figure 9C:
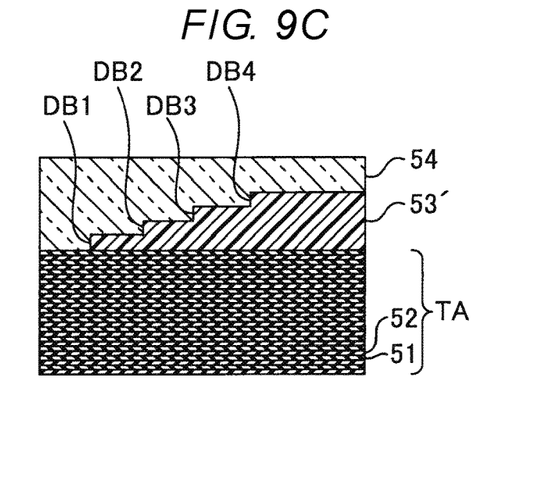

Next, as illustrated in FIG. 9C, the template 54 is pressed to the imprint material 53, so that an imprint pattern 53' is formed on the stacked body TA. The imprint pattern 53' may be provided with stepped portions DB1 to DB4 with the stepped portions DA1 to DA4 of the template 54 transferred thereto.

Figure 9D:
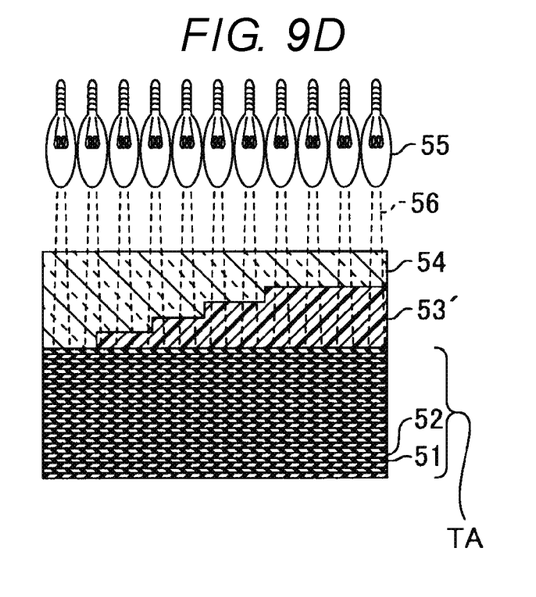

Next, as illustrated in FIG. 9D, the imprint pattern 53' is irradiated with ultraviolet light 56 from light sources 55 to while the template 54 is being pressed to the imprint pattern 53', so that the imprint pattern 53' is cured. In this case, it is possible to select light sources 55, which are simultaneously turned on so as to emit the ultraviolet light 56 corresponding to the shape of the shot region SHA. In this way, even when the imprint material 53 protrudes beyond the shot region SHA, it is possible to prevent the imprint material 53 from being cured.

Figure 9E:
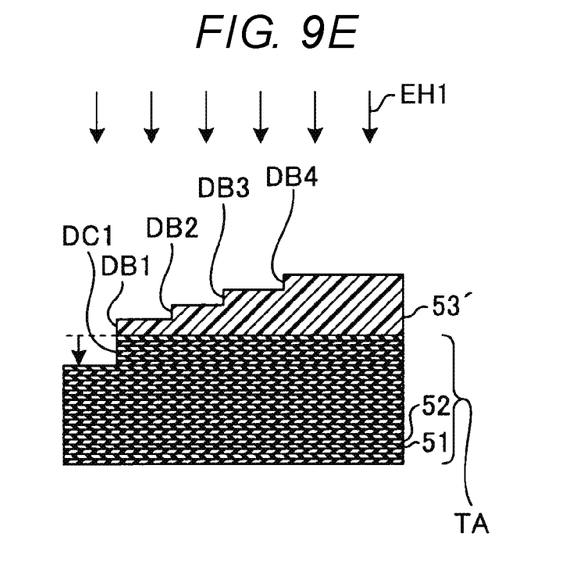

Next, as illustrated in FIG. 9E, the imprint material 53 is cured, and then the template 54 is separated from the imprint pattern 53'. Then, by etching EH1 of the insulating layers 51 and 52 using the imprint pattern 53' as a mask, a stepped portion DC1 may be formed in the stacked body TA. For the etching EH1 of the insulating layers 51 and 52, CF-based gas can be used.

Figure 9F:
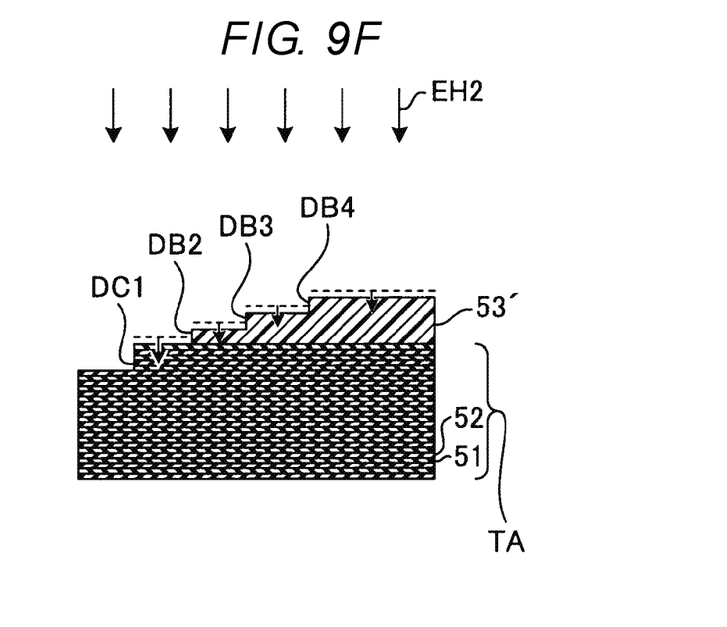

Next, as illustrated in FIG. 9F, by etching EH2 of the imprint pattern 53', the imprint pattern 53' is thinned and a stepped portion DB1 of the lowest stepped layer of the imprint pattern 53' is removed. For the etching EH2 of the imprint pattern 53', $O_2$-based gas can be used.

Figure 9G:
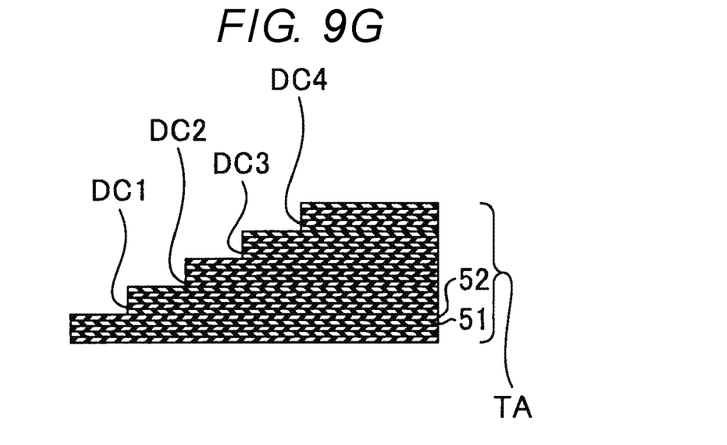

Next, as illustrated in FIG. 9G, the processes of FIG. 9E and FIG. 9F are repeated step by step, so that stepped portions DC2 to DC4 are formed in the stacked body TA.

In the imprint lithography, a stepped shape having a three-dimensional structure can be formed with a one-time transfer of the template 54. Therefore, in order to form the stepped shape having the three-dimensional structure, since a resist pattern does not need to be formed many times, it is possible to improve throughput while reducing cost. In addition, as the stepped shape having the three-dimensional structure, a three-dimensional wiring structure can be used. The three-dimensional wiring structure can be used in a nonvolatile memory such as a NAND flash memory having a three-dimensional structure and a ReRAM (Resistive Random Access Memory) having a three-dimensional structure.

While certain embodiments have been described, these embodiments have been presented byway of example only, and are not intended to limit the scope of the present disclosure. Indeed, the embodiments described herein may be embodied in a variety of other forms; furthermore, various omissions, substitutions and changes in the form of the embodiments described herein may be made without departing from the spirit of the present disclosure. The accompanying claims and their equivalents are intended to cover such forms or modifications as would fall within the scope and spirit of the present disclosure.

What is claimed is:
1. An imprint apparatus comprising:
a plurality of light sources capable of being independently turned on and turned off and generating ultraviolet light having directionality in directions of shot regions of a template pattern, the plurality of light sources being provided right above the template pattern; and a controller connected to the light sources and configured to control a distribution of the light sources to be turned on, for each shot region, wherein the controller is configured to select at least a subset of the light sources and simultaneously turn on the at least the subset of the light sources so as to emit the ultraviolet light corresponding to a shape of each shot region, and wherein the plurality of light sources are provided for covering the shot regions and the plurality of the light sources are turned on and off while positions of all the light sources are being fixed.

2. The imprint apparatus according to claim 1, further comprising:
a base configured to support the imprint apparatus;
a stage configured to place a wafer thereon;
a horizontal driver configured to drive the stage in a horizontal direction;
a template provided with the template pattern;
a vertical driver configured to drive the template in a vertical direction;
an irradiator configured to irradiate the wafer with ultraviolet light;
a first support configured to support the template below the vertical driver;
a dropper configured to drop an imprint material to the wafer;
a second support configured to support the vertical driver and the dropper above the wafer;
a third support configured to support the irradiator above the template; and
a fourth support configured to support the second support above the wafer.

3. The imprint apparatus according to claim 2, wherein the controller comprises:
a shot layout information acquiring module configured to acquire shot layout information which include information on sizes and positions of shot regions; and
a light source distribution control module configured to control a distribution of the light sources, which are turned on when the shot regions are irradiated for each shot region.

4. The imprint apparatus according to claim 3, wherein the light sources are arranged in a first plane in a staggered shape.

5. The imprint apparatus according to claim 3, wherein the directionality of the light sources is perpendicular to a surface of the shot regions.

6. The imprint apparatus according to claim 2, wherein the light sources are arranged in a first plane in a staggered shape.

7. The imprint apparatus according to claim 2, wherein the directionality of the light sources is perpendicular to a surface of the shot regions.

8. The imprint apparatus according to claim 1, further comprising:
a reduction projection optical system disposed between the light sources and a template.

9. The imprint apparatus according to claim 1, further comprising:
a remover configured to remove an uncured ultraviolet curing resin out of the shot regions.

10. The imprint apparatus according to claim 1, wherein the controller comprises:
a shot layout information acquiring module configured to acquire shot layout information which include information on sizes and positions of shot regions; and
a light source distribution control module configured to control a distribution of the light sources, which are turned on when the shot regions are irradiated for each shot region.

11. The imprint apparatus according to claim 10, wherein the light sources are arranged in a first plane in a staggered shape.

12. The imprint apparatus according to claim 10, wherein the directionality of the light sources is perpendicular to a surface of the shot regions.

13. The imprint apparatus according to claim 1, wherein the light sources are arranged in a first plane in a staggered shape.

14. The imprint apparatus according to claim 13, wherein the directionality of the light sources is perpendicular to a surface of the shot region.

15. The imprint apparatus according to claim 1, wherein the directionality of the light sources is perpendicular to a surface of the shot regions.

16. An imprint apparatus comprising:
a plurality of light sources capable of being independently turned on and turned off and generating ultraviolet light having directionality in directions of shot regions of a template pattern, the plurality of light sources being provided right above the template pattern;
a controller connected to the light sources and configured to control a distribution of the light sources to be turned on, for each shot region,
wherein the plurality of light sources are provided for covering the shot regions and the plurality of the light sources are turned on and turned off while positions of all the light sources are being fixed.

17. The imprint apparatus according to claim 16, wherein the controller is configured to select at least a subset of the light sources and simultaneously turn on the at least the subset of the light sources so as to emit the ultraviolet light corresponding to a shape of each shot region.

18. The imprint apparatus according to claim 16, wherein the controller comprising:
a shot layout information acquiring module configured to acquire shot layout information which include information on sizes and positions of shot regions; and
a light source distribution control module configured to control a distribution of the light sources, which are turned on when the shot regions are irradiated for each shot region.

19. The imprint apparatus according to claim 16, wherein the light sources are arranged in a first plane in a staggered shape.

* * * * *